United States Patent
Lin et al.

(10) Patent No.: US 6,634,177 B2
(45) Date of Patent: Oct. 21, 2003

(54) APPARATUS FOR THE REAL-TIME MONITORING AND CONTROL OF A WAFER TEMPERATURE

(75) Inventors: Kun-Tzu Lin, Bei Chiu Tainan (TW); Jung-Huang Peng, Hsin Chu (TW); Yu-Chih Huang, Taichung (TW); Chu-Song Shih, Kaohsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/077,516

(22) Filed: Feb. 15, 2002

(65) Prior Publication Data

US 2003/0154723 A1 Aug. 21, 2003

(51) Int. Cl.[7] .......................... F25B 21/02; F25D 29/00; F25D 23/12
(52) U.S. Cl. ............................ 62/3.2; 62/259.2; 62/161
(58) Field of Search ................................. 62/3.2, 259.2, 62/161

(56) References Cited

U.S. PATENT DOCUMENTS

| | | | | | |
|---|---|---|---|---|---|
| 4,490,982 A | * | 1/1985 | Christmas | ...................... | 62/3.2 |
| 5,040,381 A | * | 8/1991 | Hazen | ............................ | 62/3.2 |
| 5,522,215 A | * | 6/1996 | Matsunaga et al. | ............ | 62/3.2 |
| 5,550,387 A | * | 8/1996 | Elsner et al. | .................. | 257/15 |
| 5,996,353 A | * | 12/1999 | Maxwell et al. | ............... | 62/3.2 |
| 6,043,982 A | * | 3/2000 | Meissner | ..................... | 361/704 |
| 6,334,311 B1 | * | 1/2002 | Kim et al. | ..................... | 62/3.2 |
| 6,427,449 B1 | * | 8/2002 | Logan et al. | .................. | 62/3.4 |

OTHER PUBLICATIONS

Flanigan, Thermal Exchanger for a Wafer Chuck, Aug. 1, 2002, US patent application Publication US 2002/0100282 A1.*

* cited by examiner

Primary Examiner—William C. Doerrler
Assistant Examiner—Filip Zec
(74) Attorney, Agent, or Firm—Tung & Associates

(57) ABSTRACT

An apparatus for the real-time monitoring and control of a wafer temperature in a semiconductor process chamber, such as a plasma assisted deposition chamber or etch chamber, is provided. The apparatus is constructed by a wafer platform, a heat exchanger for flowing a heat exchanging medium into the wafer platform, an optical sensor for sensing the temperature of a wafer positioned on the wafer platform, and a controller for receiving a signal from the optical sensor, comparing to a pre-stored value and sending a signal to the heat exchanger to increase or decrease a flow of the heat exchanging medium. In another embodiment, a plurality of thermoelectric cooling modules is utilized for enhancing the temperature control capability of the heat exchanger by embedding the modules in the wafer platform, such as an electrostatic chuck.

14 Claims, 5 Drawing Sheets

| STANDARD THERMO - MODULES (CERAMIC SUBSTRATE) | | | | | | | |
|---|---|---|---|---|---|---|---|
| | Th=27°C | | | | | Contour size (mm) | |
| MODEL | Imax(A) | Vmax(Volts) | ΔTmax(°C) | Qcmax(Watts) | Length | Width | Thickness |
| TEC1-12708 | 8.5 | 13.5 | 62.0 | 60.0 | 40.0 | 40.0 | 3.5 |
| TEC1-12708 | 6.4 | 13.5 | 62.0 | 50.0 | 40.0 | 40.0 | 3.8 |
| TEC1-12708 | 5.6 | 13.5 | 62.0 | 42.0 | 40.0 | 40.0 | 3.8 |
| TEC1-12708 | 4.4 | 13.5 | 62.0 | 36.0 | 40.0 | 40.0 | 4.6 |
| TEC1-12708 | 3.4 | 13.5 | 62.0 | 30.0 | 40.0 | 40.0 | 4.6 |
| TEC1-12708 | 3.4 | 13.5 | 62.0 | 28.0 | 30.0 | 30.0 | 3.8 |
| TEC1-12708 | 5.4 | 8.0 | 62.0 | 24.0 | 30.0 | 30.0 | 4.0 |
| TEC1-12708 | 3.4 | 8.0 | 62.0 | 18.0 | 30.0 | 30.0 | 4.6 |
| TEC1-12708 | 5.4 | 5.5 | 62.0 | 16.0 | 25.0 | 25.0 | 4.0 |
| TEC1-12708 | 3.4 | 5.5 | 62.0 | 12.0 | 25.0 | 25.0 | 4.6 |
| TEC1-12708 | 5.4 | 3.5 | 62.0 | 10.0 | 20.0 | 20.0 | 4.0 |
| TEC1-12708 | 3.4 | 3.5 | 62.0 | 7.0 | 20.0 | 20.0 | 4.6 |
| TEC1-12708 | 5.4 | 2.0 | 62.0 | 5.5 | 14.2 | 14.2 | 4.0 |
| TEC1-12708 | 3.4 | 2.0 | 62.0 | 4.0 | 14.2 | 14.2 | 4.6 |

*Figure 8*

APPARATUS FOR THE REAL-TIME MONITORING AND CONTROL OF A WAFER TEMPERATURE

FIELD OF THE INVENTION

The present invention generally relates to an apparatus for the monitoring and control of a wafer temperature in a semiconductor process chamber and more particularly, relates to an apparatus for the real-time monitoring and control of a wafer temperature positioned on an electrostatic chuck by using a plurality of thermoelectric cooling module and/or an optical sensor for sensing a temperature of the wafer.

BACKGROUND OF THE INVENTION

In the fabrication of modern integrated circuit devices, one of the key requirements is the ability to construct plugs or interconnects in reduced dimensions such that they may be used in a multi-level metalization structure. The numerous processing steps involved require the formation of via holes for the plug or interconnect in a dimension of 0.5 μm or less for use in high-density logic devices. For instance, in forming tungsten plugs by a chemical vapor deposition method, via holes in such small dimensions must be formed by etching through layers of oxide and spin-on-glass materials at a high etch rate. A high-density plasma etching process utilizing a fluorine chemistry is frequently used in the via formation process.

In a modern etch chamber, an electrostatic wafer holding device, i.e., an electrostatic chuck or commonly known as an E-chuck, is frequently used where the chuck electrostatically attracts and holds a wafer that is positioned on top. The E-chuck holding method is highly desirable in the vacuum handling and processing of wafers. In contrast to a conventional method of holding wafers by mechanical clamping means where only slow movement is allowed during wafer handling, an E-chuck device can hold and move wafers with a force equivalent to several tens of torr pressure.

Electrostatic chucking is a technique used to secure a wafer onto a susceptor in a wafer processing chamber. In more recently developed wafer processing technology, the electrostatic wafer holding technique is frequently employed in which a chuck electrostatically attracts and holds the wafer. It is a highly desirable technique used in the vacuum handling and processing of silicon wafers. In contrast to a conventional method of holding wafers by either gravity or mechanical clamping means where only slow motion of the susceptor is allowed during wafer handling, an electrostatic wafer holding device can hold wafers with a force that is significantly higher. Since there are no moving parts acting on the wafer, there are no particle generation or contamination problems in the processing chamber.

Electrostatic chucks have been used to overcome the nonuniform clamping associated with mechanical clamping devices. The electrostatic chuck utilizes the attractive coulomb force between oppositely charged surfaces to clamp together an article and a chuck. It is generally recognized that in an electrostatic chuck, the force between the wafer and the chuck is uniform for a flat wafer and a flat chuck. This is in contrast to a mechanical clamping system where the clamping is effected around the peripheral of a wafer. Special provisions must be made to compensate for the bowing at the center of the wafer caused by the pressure of cooling gas which is pumped in between the wafer and the pedestal that is supporting and cooling the wafer. For instance, in order to compensate for the bowing of the wafer, one solution is to make the pedestal in a domed or bowed shape. This is eliminated in an electrostatic chuck where the wafer is held on a substantially planar chuck surface with an even electrostatic force distributed according to the electrode layout. The electrostatic force is generally sufficient to prevent bowing of the wafer and to promote uniform heat transfer over the entire wafer surface.

In the normal operation of an electrostatic chuck, one or more electrodes formed in the chuck body induce an electrostatic charge on the surface of a dielectric material that is coated over the chuck surface facing the wafer, i.e., between the bottom surface of the wafer and the top surface of the chuck. A typical dielectric material that can be used for such purpose is, for instance, a polyimide material. The electrostatic force between the wafer and the chuck is proportional to the square of the voltage between them and to the dielectric constant of the dielectric layer, and inversely proportional to the square of the distance between the wafer and the chuck, i.e., $$\text{Electrostatic Chucking Force} = k(V/d)^2$$

wherein k is the dielectric constant of the dielectric layer. V is the voltage drop across the dielectric film, and d is the thickness of the dielectric layer. The charging/discharging time constant is RC. When R is very large for a thick oxide backing layer (i.e., d is very large), the electrostatic chucking force can be greatly reduced causing the electrostatic chucking of the wafer to fail.

Since the principal of electrostatic chucking is that there must exist an attractive force between two parallel plates, i.e., between the silicon wafer and the susceptor that have opposite electrical charges, the chucking efficiency is not only determined by the bias voltage, the electric constant of the system, the effective distance between the two parallel plates, but also determined by the wafer grounding efficiency. To utilize electrostatic chucking efficiently in a wafer processing chamber, the surface of the wafer should be electrically conductive so that it can be properly grounded.

A typical inductively coupled plasma etch chamber 10 is shown in FIG. 1. In the etch chamber 10, which is similar to a Lam TCP® etcher made by the Lam Research Corp., the plasma source is a transformer-coupled plasma source which generates high-density, low-pressure plasma 12 decoupled from the wafer 14. The plasma source allows independent control of ion flux and ion energy. Plasma 12 is generated by a flat spiral coil 16, i.e., an inductive coil, which is separated from the plasma by a dielectric plate 18, or a dielectric window on top of the reactor chamber 20. The wafer 14 is positioned away from the coil 16 so that it is not affected by the electromagnetic field generated by the coil 16. There is very little plasma density loss because plasma 12 is generated only a few mean free paths away from the wafer surface. The Lam TCP® plasma etcher therefore enables a high-density plasma and high-etch rates to be achieved. In the plasma etcher 10, an inductive supply 22 and a bias supply 24 are used to generate the necessary plasma field. Multi-pole magnets 26 are used surrounding the plasma 12 generated. A wafer chuck 28 is used to hold the wafer 14 during the etching process. A ground 30 is provided to one end of the inductive coil 16.

In a typical inductively coupled RF plasma etcher 10 shown in FIG. 1, a source frequency of 13.56 MHZ and a substrate bias frequency of 13.56 MHZ are utilized. An ion density of approximately $0.5 \sim 2 \times 10^{12}$ cm$^3$ at wafer, an electron temperature of 3.5~6 eV and a chamber pressure of 1~25 m Torr are achieved or used.

In the typical plasma etch chamber 10, a cooling means for the wafer backside is provided in an E-chuck for controlling the wafer temperature during the plasma processing. This is shown in FIG. 2 for the plasma etcher 40. In the conventional plasma etcher 40, E-chuck 42 is provided for supporting a wafer 44 thereon. E-chuck 42 can be constructed of either a metallic material or of a polymeric material. A plurality of ventilation apertures (not shown) are provided in the E-chuck surface such that a cooling gas can be supplied to the backside 46 of the wafer 44 during plasma processing. The plurality of ventilation apertures in the E-chuck 42 is connected in fluid communication with a cooling gas inlet conduit 38 for feeding a cooling gas into the apertures. The cooling gas inlet conduit 38 is in turn connected to a gas supply line 36, a flow control valve 34 and a cooling gas supply 32. The pressure in the cooling gas supply line 36 is monitored by a pressure sensing device 48 which in turn sends a signal 50 to a controller 52. The controller 52, after receiving signal 50 and comparing to a pre-stored value, sends signal 54 to the flow control valve 34 for opening or closing the valve and thus increasing or decreasing the cooling gas supply through the supply line 36, 38 into the E-chuck 42. The amount of the cooling gas that is supplied to the E-chuck 42 is further adjusted by a needle valve 56 and pumped away by a pump 58.

As shown in FIG. 2, the conventional method for controlling the E-chuck temperature and the wafer temperature is ineffective since there is no feedback control loop for achieving an efficient control of the cooling gas pressure that flows through the E-chuck 42. The temperature of the wafer 44 during plasma processing can not be detected and thus, the temperature can exceed a critical limit to cause a detrimental effect on the coating layers on the wafer. For instance, during a plasma etching process conducted on a dielectric layer, the wafer temperature can increase to such an extent that a photoresist layer coated on the wafer starts to flow during the plasma-on period. The lack of precise control on the wafer temperature in a plasma etcher therefore leads to severe processing difficulties and produces low yield of the wafer.

A test conducted and data obtained on an E-chuck equipped with conventional cooling apparatus is shown in Table 1.

TABLE 1

| E-Chuck temperature (E) | Wafer temperature (W) | Deviation (W-E) |
| --- | --- | --- |
| Metal (45° C.) | 78° C. | 33° C. |
| Poly (65° C.) | 75° C. | 10° C. |

As shown in Table 1, the wafer positioned on the conventional E-chuck rises to a significantly higher temperature during plasma-on 50 that it is impossible to control the wafer temperature only by using the backside cooling gas. The backside cooling gas used can be any inert gas. This is the case when the heat-transfer medium flown between the wafer and the E-chuck is a helium gas, with the chamber pressure in the mini-Torr range and the backside helium pressure in the Torr range during the plasma-on state. When the backside helium cooling gas fails to effectively cool the wafer, a photoresist layer coated on the wafer may flow due to the excessive temperature reached during the plasma-on state.

Table 1 shows data obtained in two separate tests of poly and metal etch. Thermal dots are placed on the wafer to measure the maximum wafer temperature at specific locations during the plasma-on state. The results indicate that, for metal etching, a large temperature differential between the E-chuck and the wafer exists, i.e., as high as 33° C. During the poly etch process, a smaller temperature difference of 10° C. is observed. These data indicates that during the metal etching process, a temperature differential of 33° C. must be accounted for, i.e., or must be controlled. When not controlled, the excessively high temperature affects the etch rate, the uniformity of etching, and the etch profile obtained.

It is therefore an object of the present invention to provide an apparatus for controlling a wafer temperature that does not have the drawbacks or shortcomings of the conventional apparatus.

It is another object of the present invention to provide an apparatus for the real-time monitoring and control of a wafer temperature positioned in a semiconductor process machine.

It is a further object of the present invention to provide an apparatus for the real-time monitoring and control of a wafer temperature by utilizing an optical sensor.

It is another further object of the present invention to provide an apparatus for the real-time monitoring and control of a wafer temperature by utilizing an infrared sensing camera for measuring the temperature of the wafer.

It is still another object of the present invention to provide an apparatus for the real-time monitoring and control of a wafer temperature by utilizing a plurality of thermoelectric cooling modules for cooling a wafer platform.

It is yet another object of the present invention to provide an apparatus for the real-time monitoring and control of a wafer temperature by using a heat exchanger, an optical sensor and a controller.

It is still another further object of the present invention to provide an apparatus for the real-time monitoring and control of a wafer temperature by utilizing at least one thermoelectric cooling module, an optical sensor and a controller.

It is yet another further object of the present invention to provide an apparatus for controlling the temperature of a wafer by using at least one thermoelectric cooling module, at least one thermal couple probe and a controller.

SUMMARY OF THE INVENTION

In accordance with the present invention, an apparatus for the real-time monitoring and control of a wafer temperature is provided.

In a preferred embodiment, an apparatus for the real-time monitoring and control of a wafer temperature can be provided which includes a wafer platform for holding a wafer thereon; a heat exchanger for flowing a heat exchanging medium into the wafer platform; an optical sensor for sensing a temperature of a wafer positioned on the wafer platform; and a controller for receiving a signal from the optical sensor, comparing to a pre-stored value and sending a signal to the heat exchanger to increase or decrease a flow of the heat exchanging medium.

In the apparatus for the real-time monitoring and control of a wafer temperature, the wafer platform may be an electrostatic chuck (E-chuck). The heat exchanging medium may be a heated or a cooled heat exchanging fluid. The optical sensor may be an infrared sensing camera, and may be mounted directly over the wafer platform.

The present invention is further directed to an apparatus for the real-time monitoring and control of a wafer temperature which includes a wafer platform for holding a wafer thereon; at least one thermoelectric cooling module (TEC module) embedded in the wafer platform; an optical sensor for sensing a temperature of a wafer positioned on the wafer platform; and a controller for receiving a signal from the optical sensor, comparing to a pre-stored value and sending a signal to the at least one thermoelectric cooling module to increase or decrease a cooling effect.

In the apparatus for the real-time monitoring and control of a wafer temperature, the at least one thermoelectric cooling module may be at least six thermoelectric cooling modules arranged in an array and embedded in the wafer platform. The wafer platform may be an electrostatic chuck. The optical sensor may be an infrared sensing camera mounted directly over the wafer platform. The apparatus may further include at least one thermocouple probe mounted in the wafer platform.

The present invention is still further directed to an apparatus for controlling the temperature of a wafer situated on a wafer platform in a semiconductor process machine which includes a wafer platform for holding a wafer thereon; at least one thermoelectric cooling module embedded in the wafer platform; at least one thermocouple probe mounted in the wafer platform; and a controller for receiving a signal from the at least one thermocouple probe, comparing to a pre-stored value and sending a signal to the at least one thermoelectric cooling module to increase or decrease a cooling effect.

In the apparatus for controlling the temperature of a wafer situated on a wafer platform in a semiconductor process machine, the wafer platform may be an electrostatic chuck. The at least one thermoelectric cooling module may be at least eight modules arranged in an array. The apparatus may further include one thermocouple probe mounted juxtaposed to a corresponding thermoelectric cooling module. The process machine may be a plasma assisted process machine, such as a plasma enhanced deposition chamber or a plasma etcher.

BRIEF DESCRIPTION OF THE DRAWINGS

These and other objects, features and advantages of the present invention will become apparatus from the following detailed description and the appended drawings in which:

FIG. 8 is a table illustrating the various properties of standard thermoelectric cooling modules.

DETAILED DESCRIPTION OF THE PREFERRED AND ALTERNATE EMBODIMENT

Figure 1:
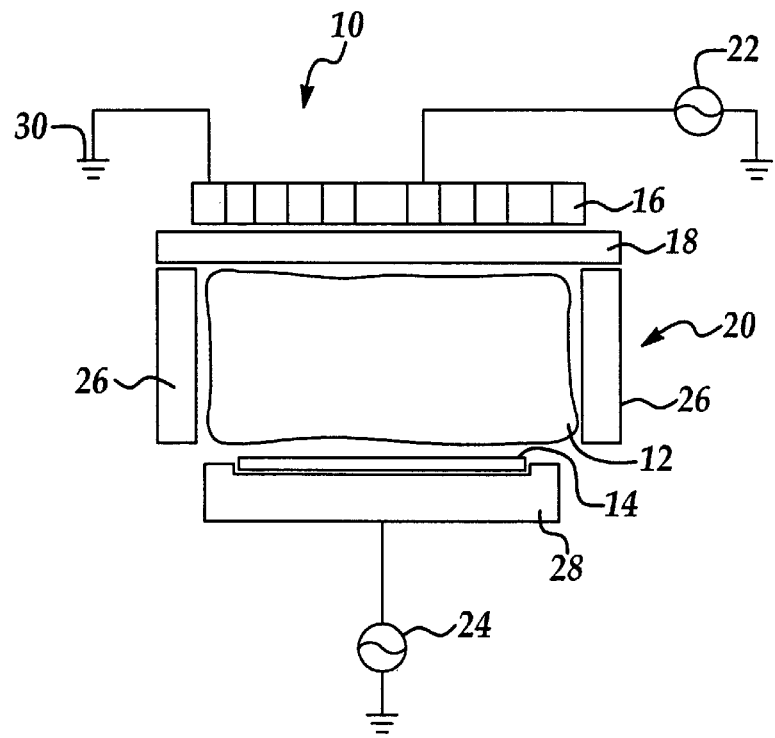
FIG. 1 is a cross-sectional view of a conventional plasma etcher equipped with an electrostatic chuck.
Figure 2:
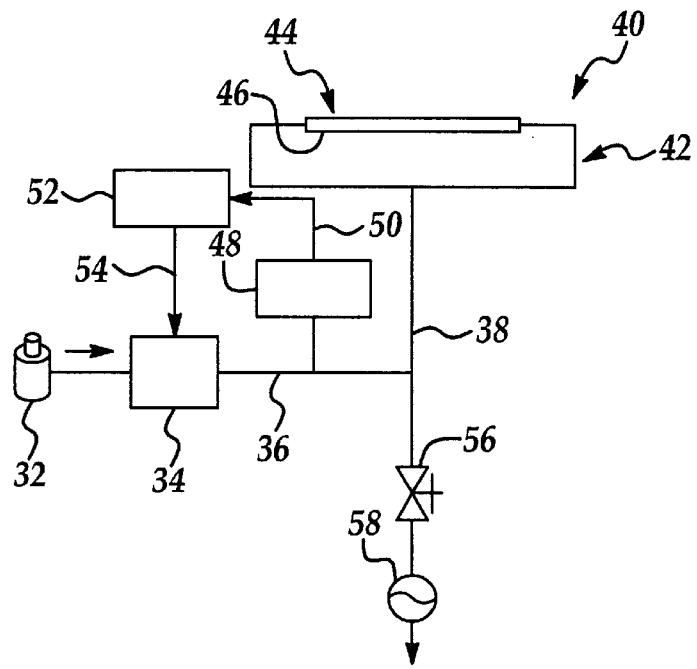
FIG. 2 is a diagram illustrating the control mechanism for the conventional electrostatic chuck of FIG. 1.

The invention discloses an apparatus for the real-time monitoring and control of a temperature of a wafer positioned in a semiconductor process chamber. The process chamber may be a plasma assisted chamber such as a plasma enhanced deposition chamber or a plasma enhanced etcher.

Three specific embodiments are illustrated in the present invention apparatus. In the first preferred embodiment, the apparatus includes a wafer platform, a heat exchanger, an optical sensor and a controller. The wafer platform may be of the electrostatic chuck type, the heat exchanger flows a heat exchanging medium into the wafer platform. The optical sensor may be of the infrared sensing type for sensing a temperature of a wafer positioned on the platform. The controller operates to receive a signal from the optical sensor, comparing to a pre-stored value and then sending a signal to the heat exchanger to increase or decrease a flow of the heat exchanging medium.

In another preferred embodiment, the present invention apparatus for the real-time monitoring and control of a wafer temperature is provided which includes a wafer platform, at least one thermoelectric cooling module, an optical sensor and a controller. The at least one thermoelectric cooling module is embedded in the wafer platform, and most likely includes at least six modules arranged in an array, i.e., equally spaced-apart circumferentially. The optical sensor senses a temperature of the wafer positioned on the platform and sends a signal to the controller such that it can be compared to a pre-stored value. The controller then sends a signal to the at least one thermoelectric cooling module to increase or decrease a cooling effect.

In still another preferred embodiment, the present invention novel apparatus for controlling the temperature of a wafer situated on a wafer platform in a semiconductor process chamber includes a wafer platform, at least one thermoelectric cooling module, at least one thermocouple probe, and a controller. The at least one thermoelectric cooling module is embedded in the wafer platform in an array. The at least one thermocouple probe is mounted in the wafer platform with one probe mounted juxtaposed to a corresponding thermoelectric cooling module. The controller is used to receive a signal from the at least one thermocouple probe, comparing to a pre-stored value and sending a signal to the at least one thermoelectric cooling module to increase or decrease a cooling effect.

The present invention novel apparatus remedies the presently used temperature controlling mechanism for an electrostatic chuck which consists of a single cooling loop or a single heating loop. The electrostatic chuck has only a single temperature control on the surface of the chuck and thus, the temperature of the chuck surface affects the wafer surface temperature and thus the etching uniformity for a plasma etching process. The problem is particularly severe for 300 mm diameter wafers wherein the E-chuck surface temperature in small regional areas cannot be adequately controlled.

The present invention novel apparatus permits local area temperature control on an E-chuck surface and thus, achieving uniform temperature control of a wafer surface during processing. The apparatus further allows an accurate temperature control of small areas. As a result, processing uniformity on the wafer can be improved due to the more accurate and E-chuck temperature control. Processing difficulties such as photoresist burn out can be prevented.

The present invention further permits a real-time monitoring and control of wafer surface temperature without using thermal dots and the pasting of dots on the wafer surface. The real-time monitoring and control is achieved by using an infrared sensing camera or other types of video cameras capable of monitoring temperature on a surface. The method utilizes real-time wafer surface temperature measurement and feedback to a control system for the real-time control of wafer surface temperature. The method prevents photoresist flow problem and increases process window.

Figure 3:
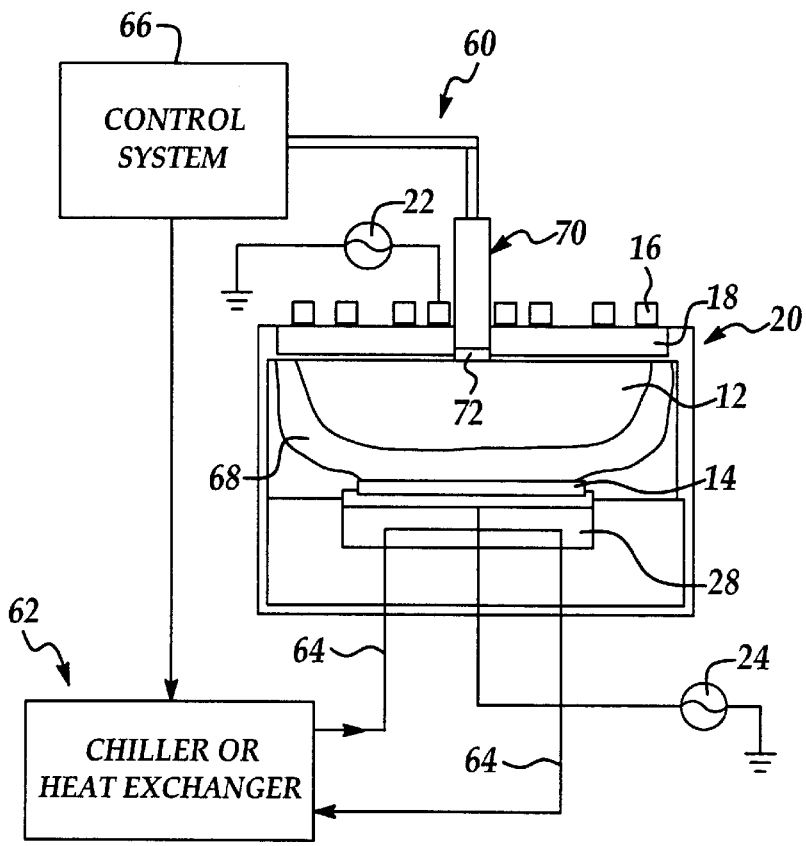
FIG. 3 is a diagram illustrating a present invention apparatus equipped with an optical sensor and a heat exchanger.

Referring now to FIG. 3, wherein a graph illustrating the present invention apparatus 60 in a preferred embodiment is shown. The apparatus 60 consists of a process chamber 20 equipped with a plasma coil 16 which is separated from the plasma 12 by a dielectric plate 18 (or a dielectric window). The process chamber 20 is further equipped with an electrostatic chuck 28 for carrying a wafer 14 on top. An inductive supply 22 and a bias supply 24 are used to generate the necessary plasma 12 inside the chamber cavity.

The present invention apparatus 60 is further provided with a heat exchanger 62 which is capable of flowing a heat exchanging medium through conduit 64 into and through the electrostatic chuck 28. A controller 66 is used for receiving a signal from an optical sensor 70, which is an infrared sensing camera with a lense 72 mounted through the dielectric window 18 for detecting a temperature on the top surface 68 of the wafer 14. The controller 66 receives a signal from the optical sensor 70 and compares the signal to a pre-stored value and then sending out a signal to the heat exchanger 62 to either increase or decease a flow of the heat exchanging medium. The heat exchanging medium may be a heated or a chilled heat exchanging fluid for either heating or cooling the electrostatic chuck 28. It should be noted that the optical sensor 70, or the infrared sensing camera should be mounted directly over the wafer 14 with a lens 72 aimed at a top surface 68 of the wafer.

Figure 4:
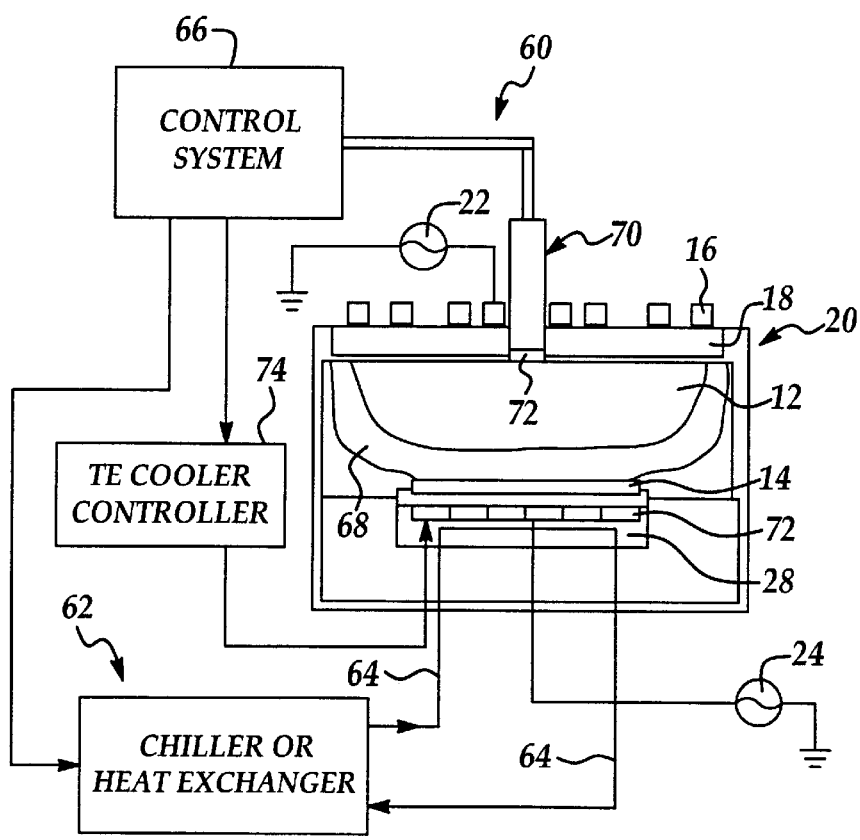
FIG. 4 is a diagram illustrating another embodiment of the present invention apparatus equipped with an optical sensor and plurality of thermoelectric cooling modules.
Figure 4A:
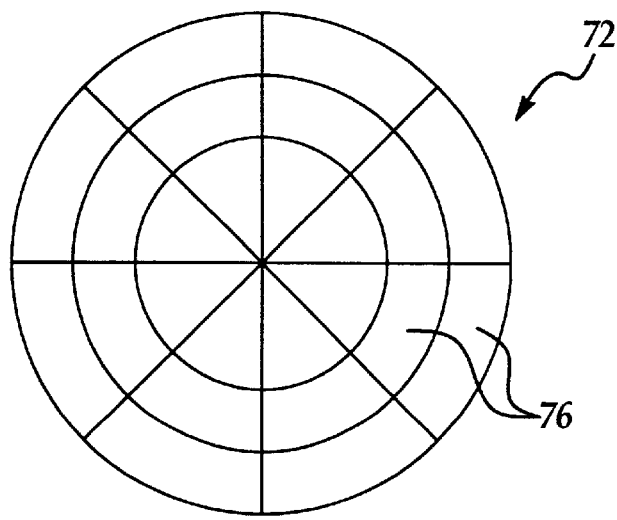
FIG. 4A is a cross-sectional view of the wafer platform of FIG. 4 illustrating an array of thermoelectric cooling modules.

In another preferred embodiment, shown in FIGS. 4 and 4A, in addition to the heat exchanger 62 used for controlling the temperature of the electrostatic chuck 28, a plurality of thermoelectric cooling modules 72 is utilized to provide cooling capacity to the electrostatic chuck 28. The plurality of thermoelectric cooling modules 72 is controlled by a thermoelectric cooling module controller 74 electrically connected in series with the controller 66 that is utilized in the first preferred embodiment. Similar to the first preferred embodiment, an optical sensor 70 is used for the real-time monitoring and control of the temperature of wafer 14, by controlling the temperature of the electrostatic chuck 28.

The plurality of thermoelectric cooling modules 72 may be arranged in any desirable arrangement. One of such arrangement is shown in FIG. 4A for controlling the temperature of a wafer, by controlling the temperature of the electrostatic chuck 28. As shown in FIG. 4A; the chuck surface is divided into twenty-four regions 76 each may be provided with a separate thermoelectric cooling modules.

Figure 6A:
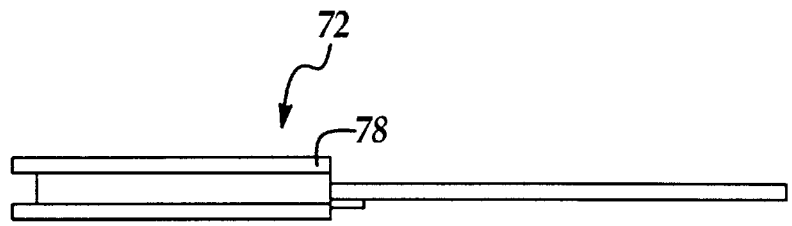
FIG. 6A is a cross-sectional view of a thermoelectric cooling module utilized in the present invention preferred embodiment.
Figure 6B:
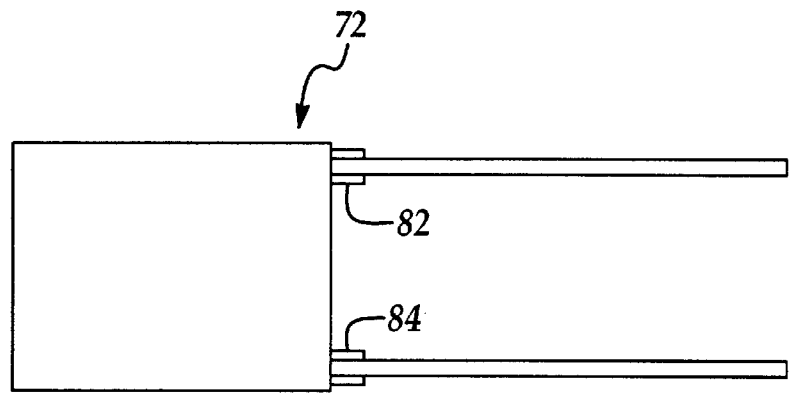
FIG. 6B is a top view of the thermoelectric cooling module of FIG. 6A.
Figure 7:
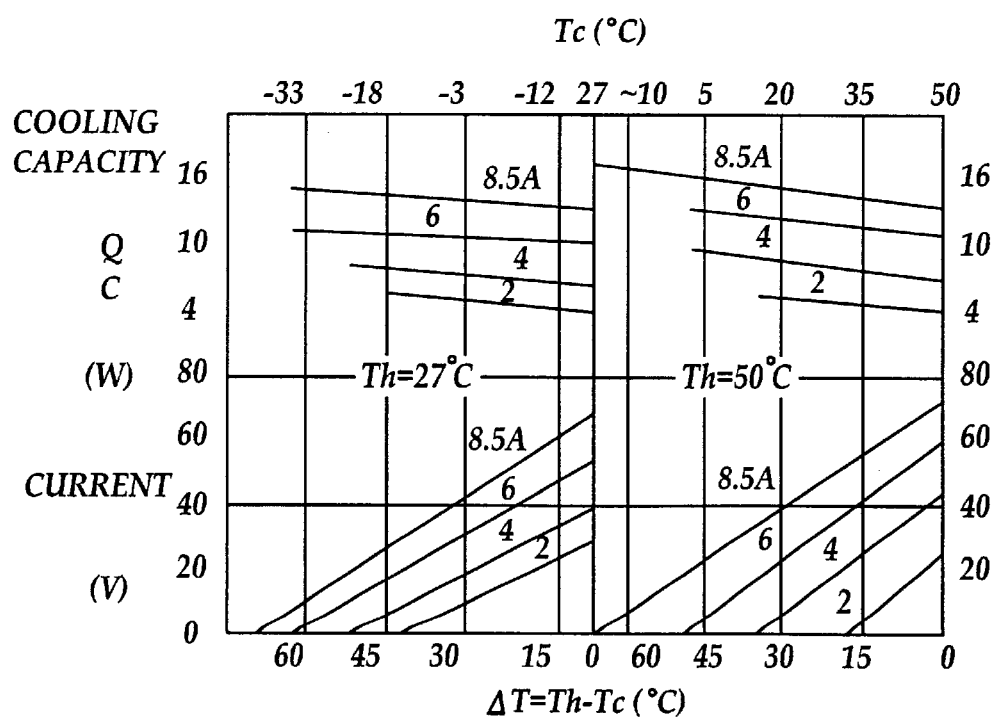
FIG. 7 is a graph illustrating the dependencies of cooling capacity and voltage on the temperature differential of the thermoelectric cooling module.

The construction of a thermoelectric cooling module 72 is shown in FIGS. 6A and 6B. The module 72 is constructed by a top plate 78 which provides a cold surface and a bottom plate 80 which provides a hot surface. Both plates 78, 80 are fabricated of a ceramic material forming a diode structure. When a DC current is flown into the module 72 through a positive electrode 82 and a negative electrode 84, a temperature differential between the two plates 78, 80 is produced. As shown in FIGS. 7 and 8, a maximum temperature differential of 62° C. can be produced between the two surfaces of the two plates 78, 80. FIG. 7 further shows the dependency of the cooling capacity and the magnitude of the current flow on the temperature differential.

Figure 5:
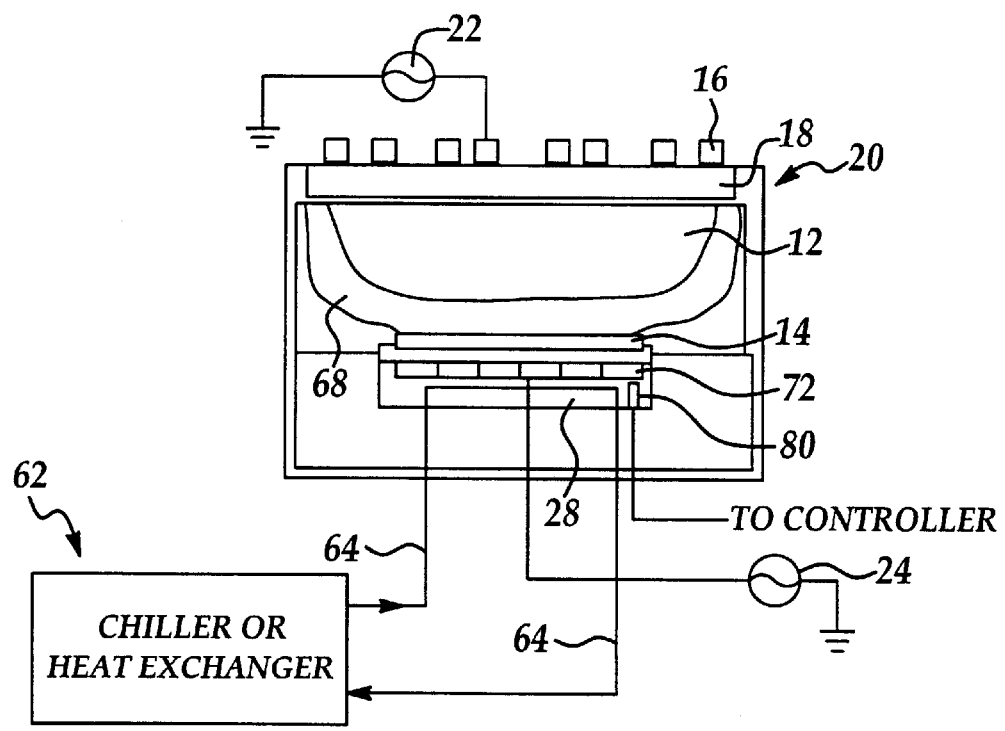
FIG. 5 is a diagram illustrating still another embodiment of the present invention apparatus utilizing a plurality of thermoelectric cooling modules and a heat exchanger.

A third preferred embodiment of the present invention apparatus is shown in FIG. 5. In this preferred embodiment, both a heat exchanger 72 and a plurality of thermoelectric cooling module 72 are used for controlling the temperature of the electrostatic chuck 28, in turn controlling the temperature of wafer 14. However, a conventional thermocouple probe 80, instead of the optical sensor 70 is used to detect the temperature of the E-chuck 28. In practice, more than one thermocouple probe should be used, i.e., ideally, a thermocouple probe should be used for each thermoelectric cooling module 72 and be positioned juxtaposed to the corresponding module. The output from the thermocouple probe 80 should be fed to a controller (not shown) which in turn feeds data to the heat exchanger 62 and to a thermoelectric cooling module controller (not shown) to provide temperature control of the E-chuck 28. The controller (not shown) is used for receiving signals from the thermocouple probes, comparing to a pre-stored value and then sending a signal to the plurality of thermoelectric cooling modules 72 to increase or decease a cooling effect of the modules.

The present invention apparatus for the real-time monitoring and control of a wafer temperature in a semiconductor process chamber has therefore been described in the above description in three separate embodiments and in the appended drawings of FIGS. 3~8.

While the present invention has been described in an illustrative manner, it should be understood that the terminology used is intended to be in a nature of words of description rather than of limitation.

Furthermore, while the present invention has been described in terms of three preferred embodiments, it is to be appreciated that those skilled in the art will readily apply these teachings to other possible variations of the inventions.

The embodiment of the invention in which an exclusive property or privilege is claimed are defined as follows.

What is claimed is:

1. An apparatus for the real-time monitoring and control of a wafer temperature comprising:
    a wafer platform for holding a wafer thereon;
    a heat exchanger for flowing a heat exchanging medium into said wafer platform;
    an optical sensor for sensing a temperature of a wafer positioned on said wafer platform, said optical sensor being an infrared sensing camera; and
    a controller for receiving a signal from said optical sensor, comparing to a pre-stored value and sending a signal to said heat exchanger to increase or decrease a flow of said heat exchanging medium.

2. An apparatus for the real-time monitoring and control of a wafer temperature according to claim 1, wherein said wafer platform is an electrostatic chuck.

3. An apparatus for the real-time monitoring and control of a wafer temperature according to claim 1, wherein said heat exchanging medium is a heated or a cooled heat exchanging fluid.

4. An apparatus for the real-time monitoring and control of a wafer temperature according to claim 1, wherein said optical sensor is mounted directly over said wafer platform.

5. An apparatus for the real-time monitoring and control of a wafer temperature comprising:
    a wafer platform for holding a wafer thereon;
    at least one thermoelectric cooling module embedded in said wafer platform;
    an optical sensor for sensing a temperature of a wafer positioned on said wafer platform, said optical sensor being an infrared sensing camera; and a controller for receiving a signal from said optical sensor, comparing to a pre-stored value and sending a signal to said at least one thermoelectric cooling module to increase or decease a cooling effect.

6. An apparatus for the real-time monitoring and control of a wafer temperature according to claim 5, wherein said at least one thermoelectric cooling module is at least six thermoelectric cooling modules arranged in an array and embedded in said wafer platform.

7. An apparatus for the real-time monitoring and control of a wafer temperature according to claim 5, wherein said wafer platform is an electrostatic chuck.

8. An apparatus for the real-time monitoring and control of a wafer temperature according to claim 5 further comprising at least one thermocouple probe mounted in said wafer platform.

9. An apparatus for controlling the temperature of a wafer situated on a wafer platform in a process machine comprising:
   a wafer platform for holding a wafer thereon;
   at least one thermoelectric cooling module embedded in said wafer platform;
   at least one thermocouple probe mounted juxtaposed to a corresponding thermoelectric cooling module;
   at least one thermocouple probe mounted in aid wafer platform; and
   a controller for receiving a signal from said at least one thermocouple probe, comparing to a pre-stored value and sending a signal to the at least one thermoelectric cooling module to increase or decrease a cooling effect.

10. An apparatus for controlling the temperature of a wafer situated on a wafer platform in a process machine according to claim 9, wherein said wafer platform is an electrostatic chuck.

11. An apparatus for controlling the temperature of a wafer situated on a wafer platform in a process machine according to claim 9, wherein said at least one thermoelectric cooling module is eight modules arranged in an array.

12. An apparatus for controlling the temperature of a wafer situated on a wafer platform in a process machine according to claim 9, wherein said process machine is a plasma assisted process machine.

13. An apparatus for controlling the temperature of a wafer situated on a wafer platform in a process machine according to claim 9, wherein said process machine is a plasma assisted deposition chamber.

14. An apparatus for controlling the temperature of a wafer situated on a wafer platform in a process machine according to claim 9, wherein said process machine is a plasma assisted etcher.

* * * * *